(12) United States Patent
Onishi et al.

(10) Patent No.: US 7,695,757 B2
(45) Date of Patent: Apr. 13, 2010

(54) METHOD OF MANUFACTURING A SUBSTRATE FOR ORGANIC ELECTROLUMINESCENT DEVICE

(75) Inventors: Yasuharu Onishi, Tokyo (JP); Satoru Toguchi, Tokyo (JP); Junichi Yamanari, Tokyo (JP); Hitoshi Ishikawa, Tokyo (JP); Tomohisa Gotoh, Tokyo (JP); Atsushi Kamijo, Tokyo (JP)

(73) Assignee: Samsung Mobile Display Co., Ltd., Yongin (KR)

( * ) Notice: Subject to any disclaimer, the term of this patent is extended or adjusted under 35 U.S.C. 154(b) by 1352 days.

(21) Appl. No.: 10/840,292

(22) Filed: May 7, 2004

(65) Prior Publication Data

US 2005/0008768 A1    Jan. 13, 2005

(30) Foreign Application Priority Data

May 8, 2003  (JP) ............... 2003-130187
May 8, 2003  (JP) ............... 2003-130303

(51) Int. Cl.
    *B05D 5/12* (2006.01)
(52) U.S. Cl. .............. 427/66; 427/58; 427/226
(58) Field of Classification Search ........... 427/58, 427/66, 226
    See application file for complete search history.

(56) References Cited

U.S. PATENT DOCUMENTS 5,234,717 A * 8/1993 Matsuno et al. ............. 427/277
5,560,957 A * 10/1996 Johnson ...................... 427/66
5,843,321 A   12/1998 Kamihara et al.
2002/0096789 A1* 7/2002 Bolken ....................... 257/787

(Continued)

FOREIGN PATENT DOCUMENTS

JP          62172691         7/1987

(Continued)

OTHER PUBLICATIONS

Chinese Office Action dated Jan. 4, 2008.

(Continued)

*Primary Examiner*—Shamim Ahmed
(74) *Attorney, Agent, or Firm*—H.C. Park & Associates, PLC

(57) ABSTRACT

Disclosed is a method of manufacturing a substrate for an organic EL device, the method comprising the step of: filling grooves of the optical element with sol-gel coating solution or organic metal cracking solution when a diffraction grating 12 is formed on the glass substrate 11, wherein an encapsulation member 5 is mounted to the glass substrate 11 in order to fill the groove 12a with the coating solution, and the coating solution is injected into a gap between the encapsulation member 5 and the diffraction grating 12, so that the organic EL device can be stably manufactured with low variation between optical properties according to positions of the substrate and with improved luminous efficiency. Further, the present invention provides a method of manufacturing a substrate for an organic EL device having a glass substrate 11 with an diffraction grating 12, wherein the dispersion solution of particles is applied to the glass substrate 11 to form the diffraction grating 12, so that the organic EL device can be stably manufactured with low variation between the optical properties according to the positions of the substrate and with the improved luminous efficiency.

18 Claims, 5 Drawing Sheets

U.S. PATENT DOCUMENTS

| | | | |
|---|---|---|---|
| 2002/0134979 A1* | 9/2002 | Yamazaki et al. | 257/59 |
| 2002/0182452 A1* | 12/2002 | Yoshihara et al. | 428/702 |
| 2003/0057417 A1 | 3/2003 | Lee et al. | |
| 2006/0063460 A1* | 3/2006 | Seo | 445/24 |

FOREIGN PATENT DOCUMENTS

| | | |
|---|---|---|
| JP | 63314795 | 12/1988 |
| JP | 01220394 | 9/1989 |
| JP | 01-315992 | 12/1989 |
| JP | 05070773 | 3/1993 |
| JP | 06-005605 | 1/1994 |
| JP | 06-308341 | 11/1994 |
| JP | 07-134337 | 5/1995 |
| JP | 08-083688 | 3/1996 |
| JP | 08298186 | 11/1996 |
| JP | 09157643 | 6/1997 |
| JP | 09268283 | 10/1997 |
| JP | 09268284 | 10/1997 |
| JP | 11283751 | 10/1999 |
| JP | 11-329742 | 11/1999 |
| JP | 2000-106278 | 4/2000 |
| JP | 2000-231985 | 8/2000 |
| JP | 2000-250027 | 9/2000 |
| JP | 2002-169486 | 6/2002 |
| JP | 2002-240057 | 8/2002 |
| JP | 200-260845 | * 9/2002 |
| JP | 2002260845 | 9/2002 |
| JP | 2003027160 | 1/2003 |
| JP | 2003-121635 | 4/2003 |
| WO | 03-026357 | 3/2003 |

OTHER PUBLICATIONS

European Search Report dated Mar. 23, 2007.
D. Vaufrey, et al.; Reactive ion etching of sol-gel-processed SnO2 transparent conducting oxide as a new material for organic light emitting diodes; Synthetic Metals 127 (2002); pp. 207-211.
Y.S. Jeong, et al.; UV-visible and infrared characterization of poly(p-xylylene) films for waveguide applications and OLED encapsulation; Synthetic Metals 127 (2002); 189-193.
C.W. Tang, et al., Organic Electroluminescent Diodes, Applied Physics Letters, vol. 51, pp. 913-915, 1987.
Tsutsuidetsuo; "Effects and Trends in Organic Electroluminescence"; Display Monthly; vol. 1, No. 3, p. 11-16, Sep. 1995. (English translation of Section 3).
European Search Report dated Jun. 23, 2008.

* cited by examiner

METHOD OF MANUFACTURING A SUBSTRATE FOR ORGANIC ELECTROLUMINESCENT DEVICE

CROSS-REFERENCE TO RELATED APPLICATION

This application claims the benefit of Japanese Patent Application Nos. 2003-130187 filed on May 8, 2003, and 2003-130303 filed on May 8, 2003, the disclosure of which is hereby incorporated herein by reference in its entirety.

BACKGROUND OF THE INVENTION

1. Field of the Invention

The present invention relates to a method of manufacturing a substrate for an organic electroluminescent display device, which comprises an optical element such as a diffraction grating, etc.

2. Description of the Related Art

An organic electroluminescent device (hereinafter, referred to as "organic EL device") is an emitting device employing a principle that fluorescent material emits light using recombination energy of holes injected from an anode and an electrons injected from a cathode. As an exemplary organic EL device, there is a low-voltage drive organic EL device with layered devices, reported by Tang C. W. et al. (Tang, C. W., VanSlyke, S. A. Applied Physics Letters, Vol. 51, p 913, 1987), and such layered device has remarkably improved luminescence properties of the organic EL device. Further, the organic EL device has been being widely developed for recent practical utilization since such a high powered organic EL device was developed.

The organic EL device having a two-layered structure, developed by Tang et al., comprises an emitting layer containing tris (8-quinolinol) aluminum (AlQ), and a hole transporting layer containing a tri-phenyl thiamine derivative such as tri-phenyl thiamine diphosphate (TDP). The reason why the two-layered structure gives good luminescence properties is because efficiency of injecting the holes into the emitting layer is increased, efficiency of creating excitons by means of the recombination is increased by blocking the electrons injected from the cathode, and the created excitons can be encapsulated in the emitting layer. Also, as an exemplary advanced structure of the two-layered structure, there has been reported a three-layered structure comprising a hole transporting layer, an emitting layer, and an electron transporting layer. Together with the two-layered structure composed of the hole transporting layer and the electron transportable emitting layer, this three-layered structure has been known as a representative structure of the organic EL device. Further, such a layered device is being required to improve its recombination efficiency of the holes and the electrons. For this purpose, various studies have been performed.

Because the organic EL device is a spontaneous emitting device having high-speed response characteristic, it is expected that the organic EL device is practically used as a fine pitch display for portable terminals and televisions. However, to produce the fine pitch organic EL display on a commercial scale, the organic EL device should be improved in luminous efficiency. Therefore, necessity to improve the luminous efficiency will be described hereinbelow.

First, in consideration of a carrier recombination principle of the organic EL device, the electrons and the holes, which are injected from the electrodes respectively, are formed into electron-hole pairs by a coulomb reaction, wherein some of the electron-hole pairs are singlet-excitons and some of them are triplet-excitons. Here, the singlet-excitons and the triplet-excitons are created at a ratio of 1 to 3. That is, when there is no phosphorescence in a triplet state, the maximum quantum yield of the emission is 25%, which means that the maximum efficiency in the organic EL device is 25%. Further, in the organic EL device, when a refraction angle of light is larger than a critical angle depending on a refractive index of the emitting layer, the light is totally reflected and thus cannot escape.

That is, if the emitting layer has a refractive index of 1.6, effective emission is about 20% of the whole emission. Additionally, under the consideration of the creation ratio of the singlet-excitons, the effective emission is about 5% of the whole emission. Thus, the luminous efficiency of the organic EL device is lowered (Tsutsuidetsuo, "Effects and trends in organic electroluminescence," Display Monthly, Vol. 1, No. 3, p 11, September 1995). For this reason, there is no alternative but to improve the luminous efficiency of the organic EL device.

To improve the luminous efficiency, there has proposed various methods of developing inorganic EL device technology, etc. By way of examples of the methods, there have been disclosed a condensed structure of a substrate (Japanese Patent Publication No. S63 (1988)-314795) and a reflection surface formed in a side of the device (Japanese Patent Publication No. H01(1989)-220394).

The foregoing examples are effective in a relatively large-sized substrate, but are disadvantageous in the fine pitch display having a small-sized substrate because it is difficult to manufacture a condensed lens and to form the reflection surface onto the side of the device. Further, in the organic EL device comprises the emitting layer having a thickness of several microns or less, it is very difficult for an ultra fine processing technology to form a reflector on the side of the organic EL device. Also, even if the reflector can be formed on the side of the organic EL device, a production cost thereof is so high that it is disadvantageous in the practical utilization.

As another example, there is disclosed a structure employing a flat layer interposed between a glass substrate and an emitting layer as an anti-reflection layer, wherein the refractive index of the flat layer is an intermediate value of the respective refractive indexes of the glass substrate and the emitting layer (Japanese Patent Publication No. S62(1987)-172691).

However, this structure improves the luminous efficiency limited to a frontward direction, but it is impossible to prevent a total reflection. That is, this anti-reflection layer is effective in the emitting layer having a high refractive index such as the inorganic EL device, but it is difficult to improve the luminous efficiency in the organic EL device which has a low refractive index as compared with the inorganic EL device.

As described above, there have been proposed various structures to improve the luminous efficiency of the organic EL device, but they are not enough to satisfy desirable performance. Accordingly, there has been disclosed still another structure comprising a substrate formed with an optical element such as a diffraction grating (Japanese Patent Publication No. H11(1999)-283751), which is considered to be effective to improve the luminous efficiency.

The above-described structures disclosed in Japanese Patent Publication Nos. 1988-314795 and 1989-220394 are effective in a relatively large-sized substrate, but is disadvantageous in the fine pitch display having a small-sized substrate because it is difficult to manufacture a condensed lens and to form the reflection surface onto the side of the device. Further, in the organic EL device where the emitting layer has a thickness of several microns or less, it is very difficult to form a reflector on the side of the organic EL device by use of an ultra fine processing technology. Also, even if the reflector can be formed on the side of the organic EL device, a production cost thereof is too high to be disadvantageous in the practical utilization.

Further, the structure disclosed in Japanese Patent Publication No. 1987-172691 improves the luminous efficiency in one (e.g. frontward) direction, but it is impossible to prevent a total reflection.

That is, this anti-reflection layer is effective in the emitting layer having a high refractive index such as the inorganic EL device, but it is difficult to improve the luminous efficiency in the organic EL device which has a low refractive index as compared with the inorganic EL device.

As described above, there have been proposed various structures to improve the luminous efficiency of the organic EL device, but they are not enough to satisfy desirable performance. Accordingly, there has been disclosed the structure disclosed in Japanese Patent Publication No. 1999-283751, and a substrate formed with an optical element such as a diffraction grating is considered to be effective to improve the luminous efficiency of the organic EL device.

However, in the organic EL device comprising the optical element, disclosed in Japanese Patent Publication No. 1999-283751, the luminous efficiency can be remarkable enhanced, but it is difficult to manufacture this structure. Particularly, it is difficult to stably form a good optical element, and variation is generated between luminescence properties in the surface of the substrate having the optical element.

Additionally, a state-of-the-art processing technology is inevitable to form grooves of the diffraction grating as the optical element by a fine pitch, and a production cost is highly increased. Therefore, there is required technology for stably and easily forming the optical element on the substrate.

Further, it is very difficult to fill the grooves during the process of forming the optical element. Typically, layer formation technology such as a sputtering method is used for filling the grooves of the optical element. However, in the conventional layer formation technology, it is impossible to completely and uniformly fill the grooves with the layer because the layer is formed depending on a surface profile of the substrate.

SUMMARY OF THE INVENTION

Accordingly, it is an object of the present invention to provide a method of manufacturing a substrate for an organic electroluminescent display device, in which the substrate capable of decreasing variation between luminescence properties and improving luminous efficiency is stably manufactured at a low production cost.

To achieve the above purposes, one aspect of the present invention provides a method of manufacturing a substrate with an optical element for an organic EL device. The method comprises the step of filling grooves of the optical element with a sol-gel coating solution or an organic metal cracking solution while the optical element is formed. Further, an encapsulation member is mounted to the substrate in order to fill the coating solution into the groove, and the coating solution is injected into a gap between the encapsulation member and the optical element.

According to another aspect of the invention, in the present method of manufacturing the substrate with the optical element for the organic EL device, the coating solution is injected into the gap between the encapsulation member and the optical element, so that the coating solution is satisfactorily filled into the grooves forming the optical element, and the optical element is stably and easily formed on the substrate because the grooves of the optical element are firmly buried. Therefore, by applying the manufactured substrate to the organic EL device, the organic EL device can be stably manufactured with low variation between the optical properties according to the positions of the substrate and with the improved luminous efficiency.

According to another aspect of the invention, in the present method of manufacturing a substrate with an optical element for an organic EL device, the optical element is formed on the substrate, the sol-gel coating solution or the organic metal cracking solution is filled into grooves of the optical element. In this method, the coating solution is applied to the substrate, pressed, plasticized and formed into a layer.

According to another aspect of the invention, in the present method of manufacturing the substrate with the optical element for the organic EL device, the method comprises the step of filling grooves of the optical element with the sol-gel coating solution or the organic metal cracking solution while the optical element is formed. Then, the coating solution is applied to the substrate, pressed, plasticized and formed to a layer, so that the grooves of the optical element are completely filled with the coating solution and uniformly formed. Thus, the organic EL device can be stably manufactured with low variation between the optical properties according to the positions of the substrate and with the improved luminous efficiency.

According to another aspect of the invention, in the present method of manufacturing a substrate with an optical element for an organic EL device, the layer formed by the sol-gel coating solution or the organic metal cracking solution preferably has a thickness of about 300 μm or less. Therefore, the luminous efficiency is improved. If the filling layer has a thickness of about 300 μm or more, the luminous efficiency of the organic EL device is deteriorated.

According to another aspect of the invention, in the present method of manufacturing a substrate with an optical element for an organic EL device, an encapsulation member is preferably made of a resin having solubility in any one of tetrahydrofuran, acetone, toluene, low-grade alcohol, high-grade alcohol, etc. In this case where the encapsulation sidewall is made of the foregoing resin, the encapsulation sidewall can be dissolved by the organic solvent after forming the filling layer, so that the encapsulation sidewall is easily removed, thereby improving the production.

According to an aspect of the invention, in the present method of manufacturing a substrate with an optical element for an organic EL device, the method comprises the step of applying dispersion solution of particles onto the substrate in order to form the optical element.

According to another aspect of the invention, in the present method of manufacturing a substrate with an optical element for an organic EL device, the method comprises the step of applying dispersion solution of particles onto the substrate, so that the grooves or the unevenness of the optical element can be not only firmly filled or buried, but also formed, thereby stably and easily forming the optical element on the substrate. Thus, by applying the manufactured substrate to the organic EL device, the organic EL device can be stably manufactured with low variation between the optical properties according to the positions of the substrate and with the improved luminous efficiency.

According to another aspect of the invention, in the present method of manufacturing a substrate for an organic EL device, which comprises an optical element and an emitting layer interposed between an anode and a cathode, the method comprises the step of applying an etchant to the substrate in order to form the optical element, so that the optical element is formed.

According to another aspect of the invention, in the present method of manufacturing a substrate for an organic EL device, particularly of forming the optical element on the substrate, the etchant is applied to the manufactured substrate to the organic EL device, so that the grooves or the unevenness of the optical element can be easily formed, and the good optical element is stably or easily formed on the substrate. Therefore, the organic EL device can be stably manufactured with low variance between the optical properties according to the positions of the substrate and with the improved luminous efficiency.

According to an aspect of the invention, the optical element indicates an element causing diffraction, scattering, reflection and refraction of light.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
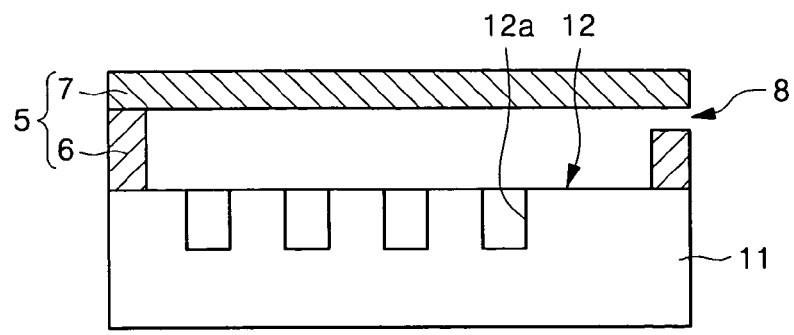
FIG. 1 is a schematic view illustrating an encapsulation member formed in lateral and opposite sides of an optical element.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

First, an organic EL device will be described, wherein the organic EL device is employed in a substrate manufactured according to the present invention.

The organic EL device comprises a glass substrate having an optical element, an anode and a cathode installed on the glass substrate, and an organic layer having an emitting layer disposed between the anode and cathode. Further, the substrate for the organic EL device refers to the glass substrate formed with the optical element.

Here, the optical element refers to an element which can have a quantitative or stable effect on diffraction, scattering, reflection and refraction of light emitted from the emitting layer. Examples of the optical element include a diffraction grating, a scattering portion, a grating, a lens, a color filter, a polarized filter etc., but the optical element is not limited thereto. The diffraction is an optical element which makes spectrums due to the diffraction of the light, and comprises a plurality of grooves by periods, wherein diffraction patterns are formed by interference of rays reflected from a smooth surface between the grooves. The scattering portion is an optical element which causes an incident ray to be scattered in random directions with respect to an obstacle when the incident ray meets the obstacle, and can be manufactured by randomly forming particles, protrusions etc., which are made of the substance having a different refractive index, in a layer.

Meanwhile, in the case where the diffraction grating is formed as the optical element, a method of manufacturing the substrate for the organic EL device comprises a filling process of filling the grooves of the glass substrate with coating solution used in a sol-gel process (hereinafter, referred to as "sol-gel coating solution") and organic metal cracking solution used in an organic metal cracking process (hereinafter, referred to as "organic metal cracking solution").

As shown in FIG. 1, to fill grooves 12a of the diffraction grating 12 with the is coating solution during the filling process, there is provided an encapsulation member 5 covering the whole main surface of the diffraction grating 12. In this filling process, the encapsulation members 5 are formed on lateral and opposite surfaces of the diffraction grating 12 facing the glass substrate 11, and then the coating solution is filled into the encapsulation members 5.

Further, in the filling process, as shown in FIG. 1, encapsulation sidewall 6 is formed along the sides of the diffraction grating 12, and an encapsulation substrate 7 is formed opposite to the main surface of the diffraction grating 12.

The encapsulation substrate 7 is formed with a uniform inside surface facing the main surface of the diffraction grating 12, and fixed onto the encapsulation sidewall 6. The encapsulation member 5 is formed with an injection port 8 placed between one of the encapsulation walls 6 and the encapsulation substrate 7 and through which the coating solution is injected. For example, the encapsulation member 5 can be made of metal, metal oxide layer, resin, etc.

Figure 2:
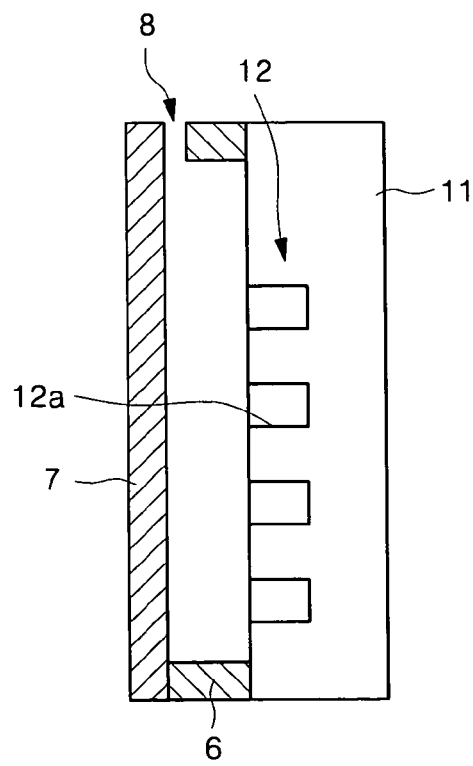
FIG. 2 is a schematic view illustrating a process of injecting filling solution into an encapsulation member formed in an optical element.
Figure 3:
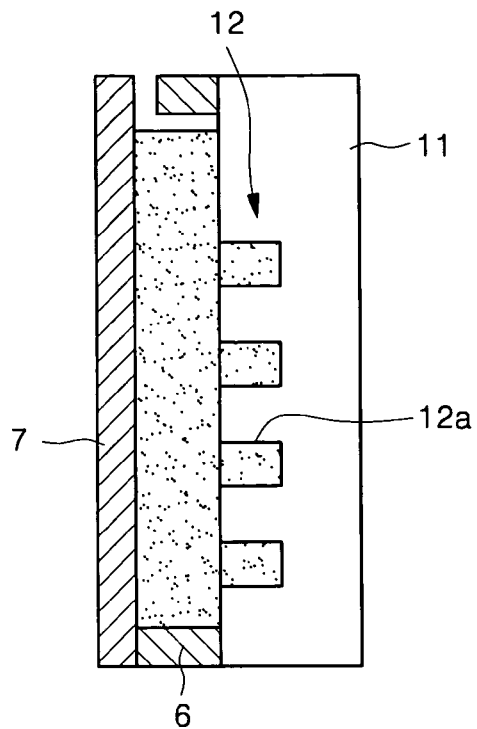
FIG. 3 is a schematic view illustrating a plastic process for coating solution injected into an encapsulation member.

In the filling process, after forming the encapsulation member 5 on the lateral and opposite surfaces of the diffraction grating 12, the sol-gel coating solution or the organic metal cracking solution is filled into the encapsulation member 5 in the state that the injection port 8 is vertically and upward disposed as shown in FIG. 2. Then, the encapsulation member 5 is plastically processed as shown in FIG. 3.

That is, the grooves 12a of the diffraction grating 12 are filled with the coating solution by injecting the coating solution such as the sol-gel coating solution or the organic metal cracking solution, which have low leakage, into the encapsulation member 5. Therefore, the grooves 12a of the diffraction grating 12 are completely filled with the coating solution and a filling layer is formed by the coating solution injected along the inside surface of the encapsulation substrate 7 of the encapsulation member 5 covering the diffraction grating 12. Therefore, after the plastic process, a flat filling layer is obtained.

Finally, in the method of manufacturing the substrate for the organic EL device according to the present invention, after forming the filling layer, the encapsulation member 5 is easily removed from the diffraction grating 12. For example, the encapsulation member 5 can be easily removed from the glass substrate 11 by solution reaction using organic solvent, chemical etching, abrasion, etc.

Other Embodiment

Other methods of manufacturing a substrate for an organic EL device will be described hereinbelow.

Figure 4:
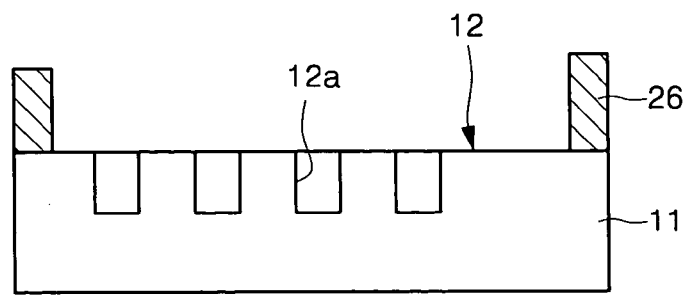
FIG. 4 is a schematic view illustrating an encapsulation sidewall formed on sides of an optical element of a glass substrate.

In other methods, as shown in FIG. 4, encapsulation sidewalls 26 are formed along the sides of the diffraction grating 12. For example, the encapsulation sidewalls 26 can be made of metal, metal oxide layer, resin, etc.

Figure 5:
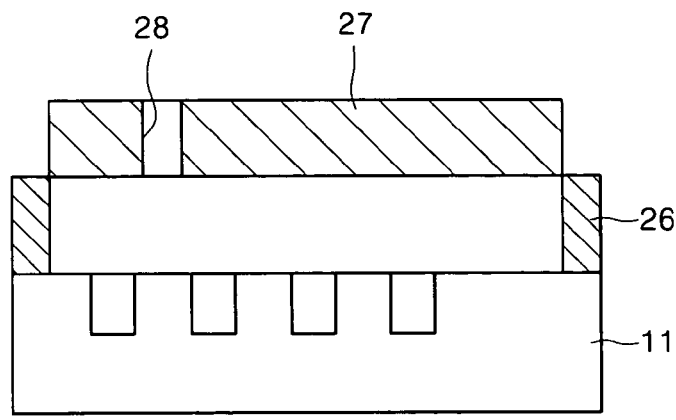
FIG. 5 is a schematic view illustrating an encapsulation substrate for pressing coating solution.

In this method, after forming the encapsulation sidewalls 26 at the sides of the diffraction grating 12, the sol-gel coating solution or the organic metal cracking solution are dropped onto the diffraction grating 12 surrounded by the encapsulation sidewall 26. Then, as shown in FIG. 5, the coating solution is pressed by an encapsulation substrate 27 inserted between the encapsulation sidewalls 26, plasticized and formed into a layer. Thus, the filling layer is formed. Here, the encapsulation substrate 27 is formed with a uniform inside surface facing the main surface of the diffraction grating 12, and formed with a ventilating hole 28 through which air surrounded by the encapsulation sidewall 26 is discharged. After forming the filling layer, the encapsulation substrate 27 is removed from between the encapsulation sidewalls 26, and then the encapsulation sidewalls 26 are removed from the glass substrate 11, thereby providing a uniform filing layer.

That is, the grooves 12a of the diffraction grating 12 are completely filled with the coating solution by injecting the coating solution, such as the sol-gel coating solution or the organic metal cracking solution, which have low leakage, between the encapsulation sidewalls 26. Further, during the plastic process, the uniform inside surface of the encapsulation substrate 27 presses the coating solution, so that the filling layer remains uniform even after dispersion solution is evaporated during the plastic process.

As the sol-gel coating solution or the organic metal cracking solution, the filling solution being on the market can be used, for example, a SOG coating solution used for a spin on glass process is exemplarily used.

For example, the sol-gel coating solution or the organic metal cracking solution preferably contains material for forming an oxide layer: silicon oxide ($SiO_2$), a titanium oxide ($TiO_2$), indium tin oxide (ITO), zinc oxide ($ZnO_2$), zirconium oxide ($ZrO_2$), tantalum pentoxide ($Ta_2O_5$), and aluminum oxide ($Al_2O_3$). According as the sol-gel coating solution or the organic metal cracking solution contains the material for forming an oxide layer: silicon oxide ($SiO_2$), titanium oxide ($TiO_2$), indium tin oxide (ITO), zinc oxide ($ZnO_2$), zirconium oxide ($ZrO_2$), tantalum pentoxide ($Ta_2O_5$), and aluminum oxide ($Al_2O_3$), the optical element is improved in the effects related to the diffraction, the reflection and the refraction, and the filling layer having stable optical properties is readily formed.

In the method according to this embodiment, the diffraction grating is employed as the optical element of the substrate for the organic EL device, so that the substrate formed with the diffraction grating can be employed in the organic EL device.

Further, the filling layer formed by the sol-gel coating solution or the organic metal cracking solution preferably has a thickness of 300 μm. If the filling layer has a thickness of 300 μm or more, the luminous efficiency of the organic EL device is deteriorated.

Further, the encapsulation member 5 is preferably made of resin having solubility in any one of tetrahydrofuran, acetone, toluene, low-grade alcohol, high-grade alcohol, etc. In this case where the encapsulation sidewall is made of the foregoing resin, the encapsulation sidewall can be dissolved by the organic solvent after forming the filling layer, so that the encapsulation sidewall is easily removed, thereby improving the production.

Hereinbelow, the organic EL device using the substrate manufactured according to the present invention will be described. The organic EL device has a layered structure of one or more organic layers between an anode and a cathode. For example, there are a structure comprising anode/emitting layer/cathode; a structure comprising anode/hole transporting layer/emitting layer/electron transporting layer/cathode layer; a structure comprising anode/hole transporting layer/emitting layer/cathode layer; and a structure comprising anode/emitting layer/electron transporting layer/cathode layer.

Preferably, the organic EL device may use a well-known hole transporting material. For example, a triphenyldiamine such as bis(D(P-tolyl) aminophenyl)-1,1-cyclohexane, N-N'-diphenyl-N-N'-bis(3-methylphenyl)-1-1'-biphenyl-4-4'-diamine, and N-N' diphenyl-N-N-bis(1-naphthyl-1,1'-biphenyl)-4-4'-diamine, a starburst molecule, and so on can be employed as the hole transporting material, but the hole transporting material is not limited thereto.

Preferably, the organic EL device may use a well-known charge transporting material. For example, an oxydiazole derivative such as 2-(4-biphenyl)-5-(4-t-buthylphenyl)-1,3,4-oxydiazole, and bis{2-(4-t-buthylphenyl)-1,3,4-oxydiazole}-m-phenylene, a triazole derivative, a quinolinol metal complex and so on can be employed as the charge transporting material, but the charge transporting material is not limited thereto.

Preferably, an emitting material for the organic EL device may use a well-known emitting material. For example, a distyrylarylene derivative, a coumarin derivative, a dicyanomethylenefiran derivative, an aromatic material disclosed in Japanese Patent Publication Nos. 1996-298186 and 1997-268284, an anthracene material disclosed in Japanese Patent Publication Nos. 1997-157643 and 1997-268283, an quinacridone derivative disclosed in Japanese Patent Publication No. 1993-70773, and so on can be employed as the emitting material, but the emitting material is not limited thereto.

The anode used in the organic EL device injects the holes into the hole transporting material or the emitting material, and preferably has a work function of 4.5 eV or more. If the anode having a work function of 4.5 ev or less is employed in the organic EL device, the hole injection property is not enough, so that the luminous efficiency is not good. For example, the anode can be made of indium tin oxide (ITO), indium zinc oxide (IZO), oxide, gold, silver, platinum, copper, etc., but is not limited thereto.

The cathode used in the organic EL device injects the electron into the electron transporting material or the emitting material, and preferably has a low work function. If the cathode having a high work function is employed in the organic EL device, the luminous efficiency is not good. For example, the cathode can be made of indium, aluminum, magnesium, magnesium-indium alloy, magnesium-aluminum alloy, aluminum-lithium alloy, aluminum-scandium -lithium alloy, magnesium-silver alloy, etc., but is not limited thereto.

Every layer of the organic EL device can be formed by a well-known method. As an exemplary method, there are a vacuum deposition method, a molecular beam epitaxy (MBE) method, a dipping method that applies a solution obtained by dissolving a material forming every layer in a solvent, a spin-coating, a casting method, a bar coating method, and a roller coating method.

As described above, In the method of manufacturing the substrate for the organic EL device, while the diffraction grating 12 is formed on the glass substrate 11, the encapsulation member 5 is mounted to the glass substrate 11 in order to fill the grooves 12a of the diffraction grating 12 with the sol-gel coating solution and the organic metal cracking solution, and then the coating solution is injected into a gap between the encapsulation member 5 and the diffraction grating 12, thereby stably and easily forming a good diffraction grating 12 on the glass substrate 11.

Further, in another method of manufacturing the substrate for the organic EL device, while the grooves 12 of the diffraction grating 12 are filled with the sol-gel coating solution and the organic metal cracking solution, the filling layer applied onto the glass substrate 11 is pressed, and then the filling layer is processed by the plastic process, so that the filling layer is completely filled into the grooves 12a of the diffraction grating 12, thereby uniformly forming the filling layer on the glass substrate 11.

According to the present invention, the diffraction grating 12 is formed on the glass substrate 11 with high density, so that variation between the luminescence properties corresponding to positions of the glass substrate 11 is decreased, and the luminous efficiency is improved, thereby stably manufacturing the organic EL device.

Further, in the method of manufacturing the substrate for the organic EL device according to the present invention, the diffraction grating 12 is employed as the optical element, but the scattering portion and other optical structures may be employed as the optical element.

Besides, in still another method of manufacturing the substrate for the organic EL device according to the present invention, dispersion solution of particles is applied onto the main surface of the glass substrate, so that the optical element is formed on the glass substrate. In the case where the diffraction grating is formed through a process of applying the dispersion solution of particles, the grooves of the diffraction groove can be filled with the applied dispersion solution of particles.

In the conventional method, the grooves of the diffraction grating to be formed on the glass substrate are filled with the metal oxide layer through the sputtering method. In such conventional method, the grooves are insufficiently filled, and are non-uniformly filled because the filling layer is formed along a surface profile of the glass substrate. Further, to uniformly form the filling layer, the abrasion can be additionally used, but it is impossible to make a surface roughness value (Ra) below nanometers. Practically, it is impossible to make the filling layer having evenness suitable for the substrate for the organic EL device.

Therefore, in the present method of manufacturing the substrate for the organic EL device, the dispersion solution of particles is applied to the glass substrate, so that the grooves of the optical element are typically filled with the glass material, thereby stably forming the uniform filling layer having a good filling property by a spin-coating method.

Further, in another method of applying the dispersion solution of particles onto the glass substrate according to the present invention, the dispersion solution of particles is applied forming a line shape and then solidified, so that beads forming the diffraction grating can be easily formed. Also, the process of applying the dispersion solution of particles can be performed by randomly applying the dispersion solution of particles on the glass substrate and solidifying it, thereby forming the beads due to the dispersion solution of particles on the glass substrate, and easily forming the scattering portion.

Additionally, in the present method of manufacturing the substrate for the organic EL device, the method of forming the glass substrate formed with the optical element and then manufacturing the substrate for the organic EL device provided with the organic layer having the emitting layer between the anode and cathode formed on the foregoing glass substrate, comprises etching the glass substrate to form the optical element. According to this method, the optical element can be stably and easily formed on the glass substrate. Thus, the substrate manufactured by this method allows the organic EL device to be stably and to have the high luminous efficiency.

Such substrate for the organic EL device with the optical element can be stably manufactured by applying an etchant to the glass substrate 11. For example, the diffraction grating or the scattering portion can be employed as the optical element. The grooves 12a of the diffraction grating 12 on the glass substrate 11 are readily formed by applying the etchant on the glass substrate 11 along a line.

In the conventional method of forming the grooves 12a for the diffraction grating 12, resists are applied onto the glass substrate 11, and then exposure, developing and etching are performed through a photomask, thereby forming the grooves 12a. However, because this conventional method comprises a plurality of processes such as a purging process for the resist, it is not easy to form the grooves 12a. On the other hand, the present process of applying the etchant to the glass substrate 11 along a line can readily form the grooves 12a of the diffraction grating 12 on the glass substrate 11, thereby reducing the number of processes as compared with the conventional method.

Further, in the present process of applying the etchant, the etchant can be randomly applied to the glass substrate besides forming the diffraction grating, so that the surface of the glass substrate is roughed, thereby easily forming the scattering portion in the glass substrate.

Further, in the present process of applying the dispersion solution of particles or the etchant, a spraying method or an inkjet method can be employed as the applying method. According as the dispersion solution of particles or the etchant is applied by the spraying method, it is possible to form a precision surface. Thus, using such substrate, the organic EL device having the improved luminous efficiency can be stably manufactured. Additionally, according as the dispersion solution of particles or the etchant is applied by the inkjet method, it is possible to apply the solution with a predetermined pattern, so that the diffraction grating and the scattering portion can be precisely formed. Here, the inkjet method can employ various ink-jet printers being on the commercial scale, such as a piezoelectric type printer, a thermal type printer, etc.

In the present method of manufacturing the substrate for the organic EL device, the sol-gel coating solution or the organic metal cracking solution is preferably employed as the dispersion solution. The sol-gel coating solution or the organic metal cracking solution allows the leakage in the glass substrate to be lowered and allows the uniform single layer to be grown by heating. For example, the sol-gel coating solution or the organic metal cracking solution preferably contains the material for forming an oxide layer: silicon oxide ($SiO_2$), titanium oxide ($TiO_2$), indium tin oxide (ITO), zinc oxide ($ZnO_2$), zirconium oxide ($ZrO_2$), tantalum pentoxide ($Ta_2O_5$), and aluminum oxide ($Al_2O_3$), the optical element is improved in the effects related to the diffraction, the reflection and the refraction, and the filling layer having stable optical properties is readily formed.

Further, in the present method of manufacturing the substrate for the organic EL device, the dispersion solution of particles preferably has a surface tension of 20~50 dyne/cm at a temperature of 25° C. Here, the surface tension indicates a static surface tension, and it can be measured by Wilhelmy's plate method. If the static surface tension of the dispersion solution is beyond 50 dyne/cm or below 20 dyne/cm, a droplet deposition may be deteriorated and particularly a bleed may be generated in the case that a predetermined pattern is formed by the inkjet method, so that it is difficult to form a good pattern.

Further, in the present method of manufacturing the substrate for the organic EL device, the dispersion solution of particles preferably has a viscosity of 1~10 cps at a temperature of 25° C. If the viscosity of the dispersion solution is beyond 10 cps or below 1 cps, the discharging stability of a droplet discharging head is deteriorated in the case that a predetermined pattern is formed by the inkjet method, so that it is difficult to form a good pattern.

Further, in the present method of manufacturing the substrate for the organic EL device, the dispersion solution of particles preferably has a blended concentration of 10% or less relative to gross weight. If the blended concentration of the particles is above 10%, the dispersing stability of the dispersion solution is deteriorated, and the droplet discharging head may be clogged in the case where the solution is discharged by the inkjet method.

Further, in the present method of manufacturing the substrate for the organic EL device, the etchant preferably contains hydrofluoric acid as a main component. According as the etchant contains hydrofluoric acid as the main component, it is possible to form the precise pattern.

Hereinafter, the organic EL device using the substrate manufactured according to the present invention will be described.

The organic EL device has a layered structure of one or more organic layers between an anode and a cathode. For example, there are a structure comprising anode/emitting layer/cathode; a structure comprising anode/hole transporting layer/emitting layer/electron transporting layer/cathode layer; a structure comprising anode/hole transporting layer/emitting layer/cathode layer; and a structure comprising anode/emitting layer/electron transporting layer/cathode layer.

Preferably, a hole transporting material for the organic EL device may use a well-known hole transporting material is used. For example, a triphenyldiamine such as bis(D(P-tolyl) aminophenyl)-1,1-cyclohexane, N-N'-diphenyl-N-N'-bis(3-methylphenyl)-1-1'-biphenyl-4-4'-diamine, and N-N'diphenyl-N-N-bis(1-naphthyl-1,1'-biphenyl)-4-4'-diamine, a starburst molecule, and so on can be employed as the hole transporting material, but the hole transporting material is not limited thereto.

Preferably, a charge transporting material for the organic EL device may use a well-known electron transporting material. For example, an oxydiazole derivative such as 2-4-biphenyl )-5-(4-t-buthylphenyl)-1,3,4-oxydiazole, and bis{2-(4-t-buthylphenyl)-1, 3,4-oxydiazole}-m-phenylene, a triazole derivative, a quinolinol metal complex, and so on can be employed as the electron transporting material, but the charge transporting material is not limited thereto.

Preferably, an emitting material for the organic EL device may use a well-known emitting material. For example, a distyrylarylene derivative, a coumarin derivative, a dicyanomethylenefiran derivative, an aromatic material disclosed in Japanese Patent Publication Nos. 1996-298186 and 1997-268284, an anthracene material disclosed in Japanese Patent Publication Nos. 1997-157643 and 1997-268283, an quinacridone derivative disclosed in Japanese Patent Publication No. 1993-70773, and so on can be employed as the emitting material, but the emitting material is not limited thereto.

The anode used in the organic EL device injects the holes into the hole transporting material or the emitting material, and preferably has a work function of 4.5 eV or more. If the anode having a work function of 4.5 ev or less is employed in the organic EL device, the hole injection property is not enough, so that the luminous efficiency is not good. For example, the anode can be made of indium tin oxide (ITO), indium zinc oxide (IZO), oxide, gold, silver, platinum, copper, etc., but is not limited thereto.

The cathode used in the organic EL device injects the electron into the electron transporting material or the emitting material, and preferably has a low work function. If the cathode having a high work function is employed in the organic EL device, the luminous efficiency is not good. For example, the cathode can be made of indium, aluminum, magnesium, magnesium-indium alloy, magnesium-aluminum alloy, aluminum-lithium alloy, aluminum-scandium-lithium alloy, magnesium-silver alloy, etc., but is not limited thereto.

Every layer of the organic EL device can be formed by a well-known method. As an exemplary method, there are a vacuum deposition method, a molecular beam epitaxy (MBE) method, a dipping method that applies a solution obtained by dissolving a material forming every layer in a solvent, a spin-coating, a casting method, a bar coating method, and a roller coating method.

As described above, In the method of manufacturing the substrate for the organic EL device, while the diffraction grating 12 is formed on the glass substrate 11, the encapsulation member 5 is mounted to the glass substrate 11 in order to fill the grooves 12a of the diffraction grating 12 with the sol-gel coating solution and the organic metal cracking solution, and then the coating solution is injected into a gap between the encapsulation member 5 and the diffraction grating 12, thereby stably and easily forming a good diffraction grating 12 on the glass substrate 11.

Embodiments

While the present invention has been described with reference to a particular embodiment, it is understood that the disclosure has been made for purpose of illustrating the invention by way of examples and is not limited to limit the scope of the invention.

Embodiment 1

Figure 6:
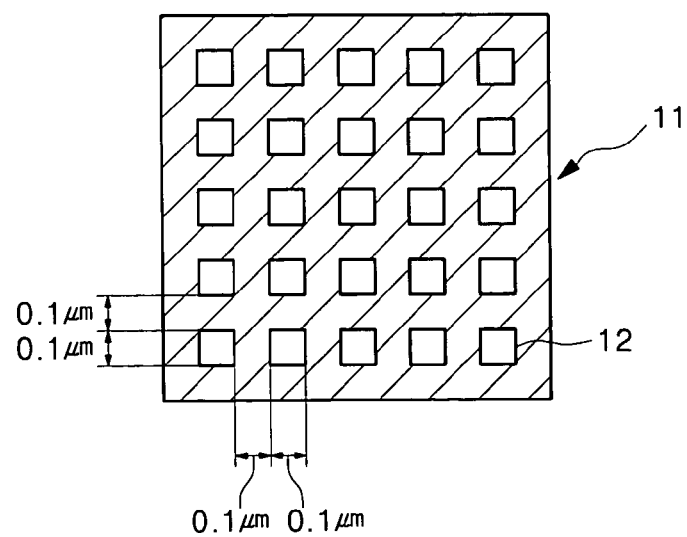
FIG. 6 is a cross-sectional view illustrating a diffraction grating formed on a glass substrate.

As shown in FIG. 6, the diffraction grating 12 was formed on the glass substrate 11 of 50 mm×50 mm (HOYA, NA(number of aperture):45, thickness: 1.1 mm). First, a pattern having a width of 0.1 μm and an interval of 0.1 μm was formed on the glass substrate 11 by a photolithography process. Then, an i-ray resist (THMR-iR1700) was formed with a thickness of 2 μm on the glass substrate 11 by the spin-coating method, and then was patterned using an i-ray stepper. Thereafter, the glass substrate 11 was dipped into hydrofluoric acid and formed with a groove having a depth of 100 nm, and then the remained resist was removed by removing solution, thereby forming the diffraction grating 12.

Thereafter, the encapsulation member 5 was formed to cover the diffraction grating 12 formed on the glass substrate 11. Here, the encapsulation member 5 includes the encapsulation sidewall 6 formed at the sides of the diffraction grating 12, and the encapsulation substrate 7 facing the main surface of the diffraction grating 12, which were formed by injecting an epoxy resin into a metal molding.

Further, in the encapsulation member 5, a distance between the main surface of the diffraction grating 12 and the inside surface of the encapsulation substrate 7 was 10 μm. Further, the encapsulation member 5 was formed with the injection port 8 between one of the encapsulation sidewall 6 and one portion of the encapsulation substrate 7 in order to inject the coating solution into the encapsulation member 5.

Figure 7:
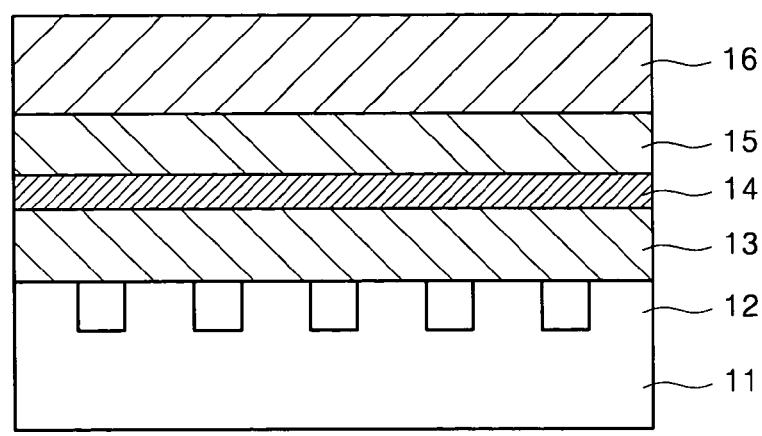
FIG. 7 is a longitudinal sectional view illustrating an organic light emitting device.

After forming the encapsulation member 5 on the diffraction grating 12 of the glass substrate 11, the main surface of the glass substrate 11 was vertically disposed and then the coating solution (Ti-05) for the organic metal cracking method was injected into the injection port 8 provided between the encapsulation sidewall 6 and the encapsulation substrate 7 so as to grow the $TiO_2$ layer. Thereafter, the coating solution was heated for thirty minutes at a temperature of 150° C., and then the glass substrate 11 was dipped in the tetrahydrofuran to remove the encapsulation member 5. Then, the glass substrate 11 was cleaned by pure water, and processed by the plastic process for three hours at a temperature of 400° C., thereby forming the $TiO_2$ layer as the filling layer. Here, the $TiO_2$ layer had a thickness of 1 μm, and had a refractive index of 2.1. Further, as shown in FIG. 7, on the $TiO_2$ layer were in turn layered the anode 13, the hole transporting layer 14, the emitting layer 15, and the cathode 16, thereby manufacturing the organic EL device.

Hereinbelow, the process of forming the organic layer comprising the anode 13, the hole transporting layer 14, the emitting layer 15, and the cathode 16 will be described.

The indium tin oxide (ITO) layer was formed on the glass substrate 11 by a sputtering method, with a thickness of 100 nm to have sheet resistance of 20 $\Omega/cm^2$, thereby forming the anode 13. Then, the anode 13 formed on the glass substrate 11 was patterned by a metal mask to have a stripe shape of 2 mm×50 mm, thereby forming five stripes of 2 mm×50 mm on the glass substrate 11.

Thereafter, the hole transporting layer 14, the emitting layer 15, and the cathode 16 were in turn deposited on the anode 13 of the glass substrate 11 by a resistance-heated vacuum deposition method, respectively. In this vacuum deposition apparatus, a molybdenum boat charged with vaporable material was arranged at a position of 250 mm under the glass substrate 11 installed in an upper portion of a vacuum tank, having an incident angle of 38 degrees with respect to the main surface of the glass substrate 11. Further, the glass substrate 11 rotates at 30 rpm. Further, the layer formation was started when pressure thereinside reaches $5\times10^7$ Torr, and a deposition speed was controlled by a quartz oscillator mounted to the side of the glass substrate 11.

Figure 9:
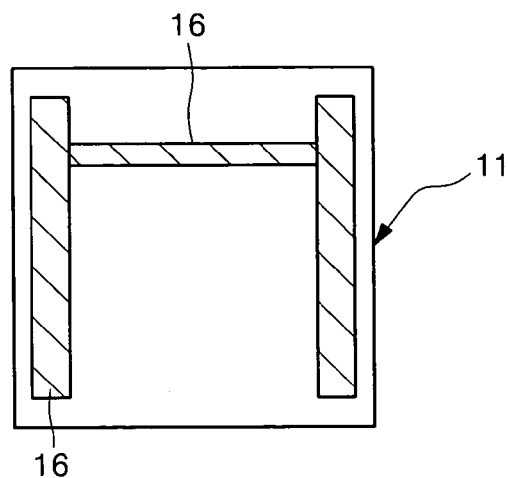
FIG. 9 is a schematic view illustrating a cathode pattern formed on a glass substrate.
Figure 10:
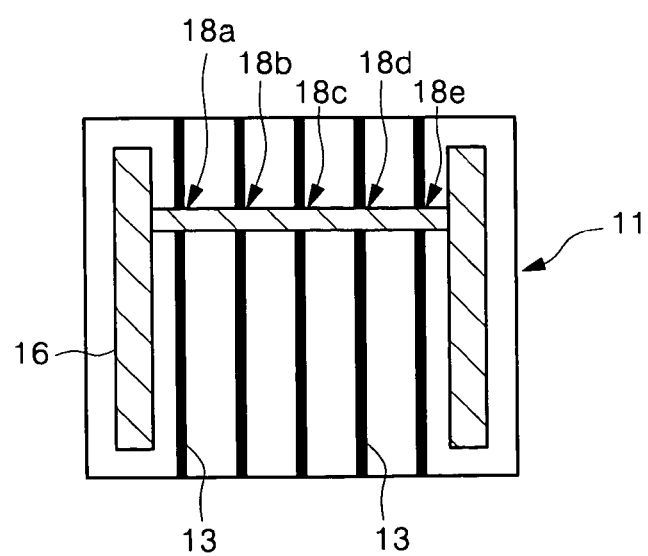
FIG. 10 is a schematic view illustrating each luminescence portion of an organic light emitting device.

Further, the deposition speed was 0.15 nm/s; N-N'-diphenyl-N-N'-bis(3-naphthyl)-1-1'-biphenyl-4-4'-diamine (hereinafter referred to as α-NMP) was used for the hole injection of 50 nm; tris(8-quinolinol)aluminum (hereinafter referred to as ALQ) was used for the emitting material of 70 nm; magnesium-silver alloy was used for the cathode of 150 nm, wherein they were in turn layered by codeposition at a deposition speed ratio of 10 to 1, thereby forming the organic EL device. Further, the cathode 16 was patterned as shown in FIG. 9, using the metal mask. Thus, as shown in FIG. 10, cathode and anode patterns 16 and 13 were formed on the main surface of the glass substrate 11, respectively, with five emitting portions 18a~18e having a size of 2 mm×2 mm.

Embodiment 2

As compared with the embodiment 1, the pitches of the diffraction grating 12 were changed. The pitch had a width of 0.05 μm, an interval of 0.05 μm, and a depth of 100 nm. Further, the processes of forming the diffraction grating 12, filling the grooves of the diffraction grating 12, and forming the organic layer were performed in the same method as the embodiment 1.

Embodiment 3

The glass substrate 11 of 50 mm×50 mm (HOYA, NA(number of aperture):45, thickness: 1.1 mm) was polished by a sand paper (#330), thereby forming the scattering portion. Here, the processes for filling the scattering portion and forming the organic layer were performed in the same method as the embodiment 1, thereby manufacturing the organic EL device.

Embodiment 4

As compared with the embodiment 1, the filling material was changed. The organic metal cracking solution (ITO-05C) for forming the indium tin oxide (ITO) layer was used. Further, the ITO layer had a thickness of 1 μm, and had a refractive index of 1.86.

Embodiment 5

As compared with the embodiment 1, the filling material was changed. The organic metal cracking solution (Zn-05C) for forming the zinc oxide (ZnO) layer was used. Further, the ZnO layer had a thickness of 1 μm, and had a refractive index of 1.92.

Embodiment 6

As compared with the embodiment 1, the filling material was changed. The organic metal cracking solution (Zr-05P) for forming the zirconium oxide ($ZrO_2$) layer was used. Further, the $ZrO_2$ layer had a thickness of 1 μm, and had a refractive index of 2.03.

Embodiment 7

Like the embodiment 1, the diffraction grating 12 having a width of 0.1 μm and a depth of 100 nm was formed on the glass substrate 11 of 50 mm×50 mm (HOYA, NA(number of aperture):45, thickness: 1.1 mm).

The encapsulation sidewall 26 was formed to leave a space of 10 μm between the main surface of the diffraction grating 12 and the inside surface of the encapsulation substrate 7. The encapsulation sidewall 26 was formed by injecting a pre-cured epoxy resin monomer into a metal molding. The encapsulation substrate 27 was formed by the epoxy resin like the encapsulation sidewall 26, having a size smaller than the space between the encapsulation sidewall 26 so as to be inserted in the space. Here, the encapsulation substrate 27 had an inside surface facing the main surface of the diffraction grating 12, and was formed with the ventilating hole 28 through which air was discharged from the encapsulation member.

Then, the coating solution (Ti-05) for forming the $TiO_2$ layer was applied to the diffraction grating 12 within the encapsulation sidewall 26 mounted to the glass substrate 11, and the encapsulation substrate 27 was put on the coating solution, and then the filling solution was pressed by a weight of 200 g, thereby performing the plastic process. The plastic process was performed for 30 minutes at a temperature of 150° C.

Thereafter, the encapsulation member was dipped in the tetrahydrofuran to remove the encapsulation member, and then the glass substrate 11 was cleaned by pure water, and processed by the plastic process for three hours at a temperature of 400° C., thereby forming the $TiO_2$ layer as a filling layer. Here, the $TiO_2$ layer had a thickness of 0.81 µm, and had a refractive index of 2.1. Further, on the $TiO_2$ layer were in turn layered the anode 13, the hole transporting layer 14, the emitting layer 15, and the cathode 16, thereby manufacturing the organic EL device.

Embodiment 8

As compared with the embodiment 7, the filling material was changed. The organic metal cracking solution (ITO-05C) for forming the indium tin oxide (ITO) layer was used. Further, the ITO layer had a thickness of 1 µm, and had a refractive index of 1.86.

Embodiment 9

As compared with the embodiment 7, the filling material was changed. The organic metal cracking solution (Zn-05C) for forming the zinc oxide (ZnO) layer was used. Further, the ZnO layer had a thickness of 1 µm, and had a refractive index of 1.92.

Embodiment 10

As compared with the embodiment 7, the filling material was changed. The organic metal cracking solution (Zr-05P) for forming the zirconium oxide ($ZrO_2$) layer was used. Further, the $ZrO_2$ layer had a thickness of 1 µm, and had a refractive index of 2.03.

COMPARATIVE EXAMPLE 1

The process of forming the organic EL device will be described. The organic EL device comprises the anode 13, the hole transporting layer 14, the emitting layer 15, and the cathode 16, which were in turn layered on the glass substrate 11.

The indium tin oxide (ITO) layer was formed as the anode 13 by a sputtering method on the glass substrate 11 of 50 mm×50 mm (HOYA, NA(number of aperture):45, thickness: 1.1 mm). The indium tin oxide (ITO) layer had a thickness of 100 nm to have sheet resistance of 20 $\Omega/cm^2$. Then, the indium tin oxide (ITO) layer was patterned by a metal mask to have a stripe of 2 mm×50 mm.

Thereafter, the hole transporting layer 14, the emitting layer 15, and the cathode 16 were in turn deposited on the indium tin oxide (ITO) layer by a resistance-heated vacuum deposition method, respectively. In this vacuum deposition apparatus, a molybdenum boat charged with vaporable material at a position of 250 mm under the glass substrate 11 installed in an upper portion of a vacuum tank, having an incident angle of 38 degrees with respect to the main surface of the glass substrate 11. Further, the glass substrate 11 rotates at 30 rpm. Further, the layer formation was started when pressure thereinside reaches $5 \times 10^7$ Torr, and a deposition speed was controlled by a quartz oscillator mounted to the side of the glass substrate 11. Further, the deposition speed was 0.15 nm/s; N-N'-diphenyl-N-N'-bis(3-naphthyl)-1-1'-biphenyl-4-4'-diamine (hereinafter referred to as α-NMP) was used for the hole injection of 50 nm; tris(8-quinolinol)aluminum (hereinafter referred to as ALQ) was used for the emitting material of 70 nm; magnesium-silver alloy was used for the cathode of 150 nm, wherein they were in turn layered by codeposition at a deposition speed ratio of 10 to 1, thereby forming the organic EL device.

COMPARATIVE EXAMPLE 2

As compared with the embodiment 1, the process of filling the grooves 12a of the diffraction grating 12 was different. Here, the grooves of the diffraction grating 12 were filled by the sputtering method, thereby forming the $TiO_2$ layer with a thickness of 1 µm and a refractive index of 2.13.

COMPARATIVE EXAMPLE 3

As compared with the embodiment 1, the process of filling the grooves 12a of the diffraction grating 12 was different. Here, the $TiO_2$ layer was formed by the organic metal cracking method. Further, the coating solution was applied to the glass substrate 11 rotating at a 2000~5000 rpm according to the spin-coating method. The plastic process for the coating solution was performed at a temperature of 400° C., and the applying and plastic processes were repeatedly performed until the thickness of the $TiO_2$ layer reaches 1 µm. At this time, the $TiO_2$ layer had a refractive index of 2.06.

COMPARATIVE EXAMPLE 4

As compared with the comparative example 3, the filling material was changed. The organic metal cracking solution (ITO-05C) for forming the indium tin oxide (ITO) layer was used. Further, the ITO aver had a thickness of 1 µm, and had a refractive index of 1.86.

COMPARATIVE EXAMPLE 5

As compared with the comparative example 3, the filling material was changed. The organic metal cracking solution (Zn-05C) for forming the zinc oxide (ZnO) layer was used. Further, the ZnO layer had a thickness of 1 µm, and had a refractive index of 1.92.

COMPARATIVE EXAMPLE 6

As compared with the comparative example 3, the filling material was changed. The organic metal cracking solution (Zr-05P) for forming the zirconium oxide ($ZrO_2$) layer was used. Further, the $ZrO_2$ layer had a thickness of 1 µm, and had a refractive index of 2.03.

(Evaluation)

In the foregoing embodiments and comparative examples, the organic EL device was estimated by first to fourth evaluations. Here, the glass substrate according to the foregoing embodiments and comparative examples was formed with five emitting portions (18a~18e) of 2 mm×2 mm as shown in FIG. 10

(First Evaluation) Luminous Efficiency

Current density ($mA/cm^2$) and brightness (cd) were measured under the conditions that a voltage of 10 V was applied to the organic EL device, and then the luminous efficiency ($cd/m^2$) was calculated depending on the measured current density ($mA/cm^2$) and brightness (cd). Here, the center of the glass substrate 11 can be determined using a photometer. Such luminous efficiency was estimated in four emitting portions 18a~18d formed on the glass substrate 11. The result of the evaluation will be shown in table 1.

(Second Evaluation) Luminous Property

Under the condition that the organic EL device was supplied with 10V, the luminescence was estimated. This evaluation was performed by naked eyes, and the luminescence was estimated with respect to the following reference. Such luminous property was estimated in four emitting portions 18a~18d formed on the glass substrate 11. The result of the evaluation will be shown in table 2.

O: good luminescence is shown throughout the surface
Δ: there is locally non-emitted
x: there is relatively large non-emitted area (Third Evaluation) Life Span Life span of the organic EL device was estimated by supplying DC current of 5 mA/cm$^2$ to the organic EL device for one hundred hours. This evaluation was performed by calculating the rate (La/Lb) of changing in the luminous efficiency (La) after 100 hours and the luminous efficiency (Lb) within 2 minutes, and the life span of the organic EL device was estimated with respect to the following reference. Such life span was estimated in the emitting portion 18e. The result of the evaluation will be shown in table 3.

O: La/Lb is beyond 0.90
Δ: La/Lb is within 0.80 and 0.90
x: La/Lb is below 0.80

(Fourth Evaluation) Variation Between Luminous Properties on the Main Surface of the Glass Substrate 11

In the foregoing embodiments and comparative examples, variation between luminous properties on the main surface of the glass substrate 11 was estimated. This evaluation was performed by measuring the respective luminous efficiencies of the emitting portions (18a~18d), and then the maximum luminous efficiency (Emax) and the minimum luminous efficiency (Emin) were estimated with respect to the following reference. Like the first evaluation, the luminous efficiency was estimated under the condition that a voltage of 10V was applied to the is organic EL device. The result of the evaluation will be shown in table 3.

O: Emin/Emax is beyond 0.90
Δ: Emin/Emax is within 0.80 and 0.90
x: Emin/Emax is below 0.80

TABLE 1

(First evaluation)

|  | Emitting portion 18a | Emitting portion 18b | Emitting portion 18c | Emitting portion 18d |
|---|---|---|---|---|
| Embodiment 1 | 5.12 | 5.37 | 5.16 | 5.20 |
| Embodiment 2 | 5.36 | 5.28 | 5.45 | 5.17 |
| Embodiment 3 | 4.70 | 5.18 | 4.89 | 5.00 |
| Embodiment 4 | 4.33 | 4.52 | 4.49 | 4.89 |
| Embodiment 5 | 5.29 | 5.36 | 5.32 | 5.13 |
| Embodiment 6 | 5.15 | 5.20 | 5.37 | 5.17 |
| Embodiment 7 | 5.29 | 5.28 | 5.25 | 5.20 |
| Embodiment 8 | 5.18 | 5.16 | 5.17 | 5.13 |
| Embodiment 9 | 5.30 | 5.33 | 5.31 | 5.34 |
| Embodiment 10 | 5.14 | 5.12 | 5.13 | 5.10 |
| Comparative example 1 | 3.92 | 3.87 | 4.03 | 3.81 |
| Comparative example 2 | 5.12 | 5.40 | — | — |
| Comparative example 3 | 5.18 | 4.46 | 5.10 | 5.21 |
| Comparative example 4 | 5.12 | 6.06 | 4.83 | — |
| Comparative example 5 | — | 5.21 | — | 5.39 |
| Comparative example 6 | — | 5.06 | 5.18 | 5.36 |

TABLE 2

(Second evlauation)

|  | Emitting portion 18a | Emitting portion 18b | Emitting portion 18c | Emitting portion 18d |
|---|---|---|---|---|
| Embodiment 1 | o | o | o | o |
| Embodiment 2 | o | o | o | o |
| Embodiment 3 | o | o | o | o |
| Embodiment 4 | o | o | o | o |
| Embodiment 5 | o | o | o | o |
| Embodiment 6 | o | o | o | o |
| Embodiment 7 | o | o | o | o |
| Embodiment 8 | o | o | o | o |
| Embodiment 9 | o | o | o | o |
| Embodiment 10 | o | o | o | o |
| Comparative example 1 | o | o | o | o |
| Comparative example 2 | o | o | x | x |
| Comparative example 3 | o | Δ | o | o |
| Comparative example 4 | o | o | o | x |
| Comparative example 5 | x | Δ | x | o |
| Comparative example 6 | x | o | o | Δ |

TABLE 3

(Third and Fourth evaluations)

|  | Third evaluation (La/Lb) | Fourth evaluation (Emin/Emax) |
|---|---|---|
| Embodiment 1 | o(0.974) | o(0.953) |
| Embodiment 2 | o(0.952) | o(0.949) |
| Embodiment 3 | o(0.931) | o(0.907) |
| Embodiment 4 | o(0.940) | o(0.923) |
| Embodiment 5 | o(0.961) | o(0.957) |
| Embodiment 6 | o(0.913) | o(0.959) |
| Embodiment 7 | o(0.970) | o(0.983) |
| Embodiment 8 | o(0.981) | o(0.990) |
| Embodiment 9 | o(0.978) | o(0.983) |
| Embodiment 10 | o (0.989) | o(0.992) |
| Comparative example 1 | o (0.906) | o(0.945) |
| Comparative example 2 | x(0.763) | x |
| Comparative example 3 | x(0.651) | Δ(0.867) |
| Comparative example 4 | x(0.692) | x |
| Comparative example 5 | x(0.732) | x |
| Comparative example 6 | x(0.671) | x |

As shown in Tables 1, 2, and 3, on the basis of the results of the estimation of each embodiment and each comparative example, the substrate manufactured by the method according to the present invention was employed for the organic EL device, so that variation between luminous properties on the glass substrate 11 according to the positions was decreased, thereby stably manufacturing the organic EL device with good luminescence and improved luminous efficiency.

Embodiment 11

As shown in FIG. 6, the diffraction grating 12 was formed on the glass substrate 11 of 50 mm×50 mm (HOYA, NA(number of aperture):45, thickness: 1.1 mm). First, a pattern having a width of 0.1 μm and an interval of 0.1 μm was formed on the glass substrate 11 by a photolithography process. Then, an i-ray resist (THMR-iR1700) was formed with a thickness of 2 μm on the glass substrate 11 by the spin-coating method, and then was patterned using an i-ray stepper. Thereafter, the glass substrate 11 was dipped into hydrofluoric acid and formed with a groove having a depth of 100 nm, and then the remained resist was removed by removing solution, thereby forming the diffraction grating 12.

Thereafter, the grooves 12a of the diffraction grating 12 were filled with the organic metal cracking solution (Ti-05) for forming the $TiO_2$ layer. The coating solution was applied to the glass substrate 11 rotating at 2000~5000 rpm based on the spin-coating method. The plastic process was performed for three hours at a temperature of 400° C., and the spin-coating was twice performed. Here, the $TiO_2$ layer had a thickness of 200 nm. Further, as shown in FIG. 7, on the $TiO_2$ layer were in turn layered the anode 13, the hole transporting layer 14, the emitting layer 15, and the cathode 16, thereby manufacturing the organic EL device.

Hereinbelow, the process of forming the organic layer comprising the anode 13, the hole transporting layer 14, the emitting layer 15, and the cathode 16 will be described.

Figure 8:
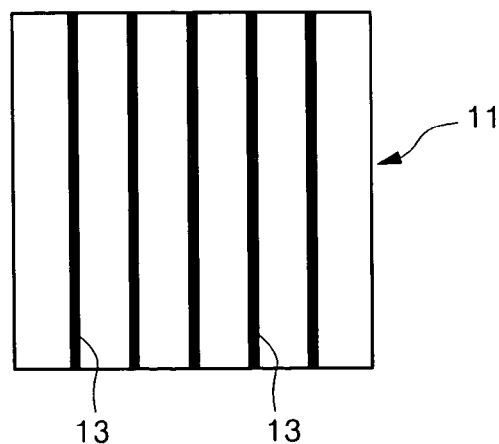
FIG. 8 is a schematic view illustrating an anode pattern formed on a glass substrate.

The indium tin oxide (ITO) layer was formed on the glass substrate 11 by a sputtering method, thereby forming the anode 13. Then, the anode 13 formed on the glass substrate 11 was patterned by a metal mask to have a stripe shape of 2 mm×50 mm, thereby forming five stripes of 2 mm×50 mm on the glass substrate 11 as shown in FIG. 8. Here, the $TiO_2$ layer forming the anode 13 had a thickness of 10 nm and had a sheet resistance of 2 $\Omega/cm^2$, Thereafter, the hole transporting layer 14, the emitting layer 15, and the cathode 16 were in turn deposited on the anode 13 of the glass substrate 11 by a resistance-heated vacuum deposition method, respectively. In this vacuum deposition apparatus, a molybdenum boat charged with vaporable material at a position of 250 mm under the glass substrate 11 installed in an upper portion of a vacuum tank, having an incident angle of 38 degrees with respect to the main surface of the glass substrate 11. Further, the glass substrate 11 rotates at 30 rpm. Further, the layer formation was started when pressure thereinside reaches $5 \times 10^7$ Torr, and a deposition speed was controlled by a quartz oscillator mounted to the side of the glass is substrate 11.

Further, the deposition speed was 0.15 nm/s; N-N'-diphenyl-N-N'-bis(3-naphthyl)-1-1'-biphenyl-4-4'-diamine (hereinafter referred to as α-NMP) was used for the hole injection of 50 nm; tris(8-quinolinol)aluminum (hereinafter referred to as ALQ) was used for the emitting material of 70 nm; magnesium-silver alloy was used for the cathode of 150 nm, wherein they were in turn layered by codeposition at a deposition speed ratio of 10 to 1, thereby forming the organic EL device. Further, the cathode 16 was patterned as shown in FIG. 9, using the metal mask. Thus, as shown in FIG. 10, cathode and anode patterns 16 and 13 were formed on the main surface of the glass substrate 11, respectively, with five emitting portions 18a~18e having a size of 2 mm×2 mm.

Embodiment 12

As compared with the embodiment 11, the pitches of the diffraction grating 12 were changed. The pitch had a width of 0.05 μm, and an interval of 0.05 μm. Further, the processes of forming the diffraction grating 12, filling the grooves of the diffraction grating 12, and forming the organic layer were performed in the same method as the embodiment 11.

Embodiment 13

The scattering portion was formed on the glass substrate 11 of 50 mm×50 mm (HOYA, NA:45, thickness: 1.1 mm) by applying a standard hydrofluoric acid solution. That is, the standard hydrofluoric acid solution was sprayed on the glass substrate 11, so that the surface of the glass substrate 11 was roughed, thereby forming the scattering portion. Thereafter, the evenness of the scattering portion was filled with the organic metal cracking solution (Ti-05) for forming the $TiO_2$ layer, like the embodiment 11. Here, the $TiO_2$ layer had a thickness of 300 nm. Further, on the $TiO_2$ layer were in turn layered the anode 13, the hole transporting layer 14, the emitting layer 15, and the cathode 16, thereby manufacturing the organic EL device. Further, the process of forming the organic layers from the anode 13 to the cathode 16 was performed in the same conditions as the embodiment 11.

Embodiment 14

The diffraction grating was formed on the glass substrate 11 of 50 mm×50 mm (HOYA, NA:45, thickness: 1.1 mm) by coating the organic metal cracking solution (Ti-05) for forming the $TiO_2$ layer in a line shape of 50 μm×50 μm at intervals of 50 μm using the ink-jet printer. Therefore, the $TiO_2$ layer was formed on the glass substrate 11 at intervals of 90 μm as line shapes having a size of 10 μm×50 mm and a thickness of 200 nm, thereby forming the diffraction grating.

Here, the piezoelectric type inkjet printer was employed for printing the coating solution by a line shape, which is being on the commercial scale and had a resolution of 1200 dpi. Here, to fill the diffraction grating 12 formed by the $TiO_2$ layer, the sputtering method using a $SiO_2$ target was employed, so that the $SiO_2$ layer was formed to have a thickness of 300 nm. Then, on the $SiO_2$ layer were in turn layered the anode 13, the hole transporting layer 14, the emitting layer 15, and the cathode 16, thereby manufacturing the organic EL device. Further, the process of forming the organic layers from the anode 13 to the cathode 16 was performed in the same conditions as the embodiment 11.

Embodiment 15

The scattering portion was formed on the glass substrate 11 of 50 mm×50 mm (HOYA, NA:45, thickness: 1.1 mm) by spraying the coating solution (Ti-05) for forming the $TiO_2$ layer thereon. Therefore, on the glass substrate 11 were scattered the beads of the $TiO_2$ layer having a size of 200~500 nm and a thickness of 100 nm, thereby forming the scattering portion.

To make the scattering portion flat by filling a space between the beads, the $SiO_2$ layer through the sputtering method using the $SiO_2$ target was formed, and then on the $SiO_2$ layer were in turn layered the anode 13, the hole transporting layer 14, the emitting layer 15, and the cathode 16, thereby manufacturing the organic EL device. Here, the $SiO_2$ layer was formed to have a thickness of 300 nm. Then, further, the process of forming the organic layers from the anode 13 to the cathode 16 was performed in the same conditions as the embodiment 11.

Embodiment 16

The diffraction grating was formed on the glass substrate 11 of 50 mm×50 mm (HOYA, NA:45, thickness: 1.1 mm) by applying the standard hydrofluoric acid solution in a line shape of 50 μm×50 nm at intervals of 50 μm using the inkjet printer. Therefore, the grooves were periodically formed on the glass substrate 11 along the lines, thereby forming the diffraction grating 12. Here, the grooves of the diffraction grating 12 had a width of 80 μm and a depth of 300 nm at intervals of 20 μm. Here, to fill the diffraction grating 12, the sputtering method using a $TiO_2$ layer target was employed, so that the $TiO_2$ layer was formed to have a thickness of 300 nm. Then, on the $TiO_2$ layer were in turn layered the anode 13, the hole transporting layer 14, the emitting layer 15, and the cathode 16, thereby manufacturing the organic EL device. Further, the process of forming the organic layers from the anode 13 to the cathode 16 was performed in the same conditions as the embodiment 11.

Embodiment 17

The standard hydrofluoric acid solution was sprayed on the glass substrate 11 of 50 mm×50 mm (HOYA, NA:45, thickness: 1.1 mm). Thus, the grooves having a diameter of 200~500 nm and a depth of 200 nm were scattered on the glass substrate 11, thereby forming the scattering portion. Here, to fill the grooves of the scattering portion, the sputtering method using a $TiO_2$ layer target was employed, so that the $TiO_2$ layer was formed to have a thickness of 300 nm. Then, on the $TiO_2$ layer were in turn layered the anode 13, the hole transporting layer 14, the emitting layer 15, and the cathode 16, thereby manufacturing the organic EL device. Further, the process of forming the organic layers from the anode 13 to the cathode 16 was performed in the same conditions as the embodiment 11.

COMPARATIVE EXAMPLE 7

The process of forming the organic EL device will be described. The organic EL device comprises the anode 13, the hole transporting layer 14, the emitting layer 15, and the cathode 16, which were in turn layered on the glass substrate 11.

The indium tin oxide (ITO) layer was formed as the anode 13 by a sputtering method on the glass substrate 11 of 50 mm×50 mm (HOYA, NA(number of aperture):45, thickness: 1.1 mm). The indium tin oxide (ITO) layer had a thickness of 100 nm to have sheet resistance of 20 $\Omega/cm^2$. Then, the indium tin oxide (ITO) layer was patterned by a metal mask to have a stripe shape of 2 mm×50 mm.

Thereafter, the hole transporting layer 14, the emitting layer 15, and the cathode 16 were in turn deposited on the indium tin oxide (ITO) layer by a resistance-heated vacuum deposition method, respectively.

In this vacuum deposition apparatus, a molybdenum boat charged with vaporable material at a position of 250 mm under the glass substrate 11 installed in an upper portion of a vacuum tank, having an incident angle of 38 degrees with respect to the main surface of the glass substrate 11. Further, the glass substrate 11 rotates at 30 rpm. Further, the layer formation was started when pressure thereinside reaches $5×10^7$ Torr, and a deposition speed was controlled by a quartz oscillator mounted to the side of the glass substrate 11. Further, the deposition speed was 0.15 nm/s; N-N'-diphenyl-N-N'-bis(3-naphthyl)-1-1'-biphenyl-4-4'-diamine (hereinafter referred to as α-NMP) was used for the hole injection of 50 nm; tris(8-quinolinol)aluminum (hereinafter referred to as ALQ) was used for the emitting material of 70 nm; magnesium-silver alloy was used for the cathode of 150 nm, wherein they were in turn layered by codeposition at a deposition speed ratio of 10 to 1, thereby forming the organic EL device.

COMPARATIVE EXAMPLE 8

Using the same glass substrate 11 of 50 mm×50 mm as the embodiment 11, the surface of the glass substrate 11 was polished by a sand paper (#30), thereby forming the scattering portion. That is, the surface of the glass substrate 11 was roughed by the sand paper, thereby forming the scattering portion on the glass substrate 11. After forming the scattering portion, the scattering portion was filled with the $TiO_2$ layer having a thickness of 300 nm under the same conditions as the embodiment 11. Then, on the $TiO_2$ layer were in turn layered the anode 13, the hole transporting layer 14, the emitting layer 15, and the cathode 16, thereby manufacturing the organic EL device. Further, the process of forming the organic layers from the anode 13 to the cathode 16 was performed in the same conditions as the embodiment 11.

COMPARATIVE EXAMPLE 9

Under the same conditions as the embodiment 11, the diffraction grating 12 was formed on the glass substrate 11, having a width of 0.1 μm, a length of 0.1 μm and a depth of 100 nm. Here, to fill the grooves 12a of the diffraction grating 12, the sputtering method using a $TiO_2$ as a target was employed, wherein the $TiO_2$ layer was formed to have a thickness of 200 nm. Then, on the $TiO_2$ layer were in turn layered the anode 13, the hole transporting layer 14, the emitting layer 15, and the cathode 16, thereby manufacturing the organic EL device. Further, the process of forming the organic layers from the anode 13 to the cathode 16 was performed in the same conditions as the embodiment 11.

COMPARATIVE EXAMPLE 10

Under the same conditions as the embodiment 11, the diffraction grating 12 was formed on the glass substrate 11, having a width of 0.1 μm, a length of 90 μm and a depth of 200 nm. Here, to fill the grooves 12a of the diffraction grating 12, the sputtering method using a $TiO_2$ as a target was employed, wherein the $TiO_2$ layer was formed to have a thickness of 300 nm. Then, on the $TiO_2$ layer were in turn layered the anode 13, the hole transporting layer 14, the emitting layer 15, and the cathode 16, thereby manufacturing the organic EL device. Further, the process of forming the organic layers from the anode 13 to the cathode 16 was performed in the same conditions as the embodiment 11.

(Evaluation)

In the foregoing embodiments and comparative examples, the organic EL device was estimated by fifth~seventh evaluations. Here, the glass substrate 11 according to the foregoing embodiments and comparative examples was formed with five emitting portions (18a~18e) of 2 mm×2 mm as shown in FIG. 10.

(Fifth Evaluation) Luminous Efficiency

Current density (mA/cm$^2$) and brightness (cd) were measured under the conditions that a voltage of 10V was applied to the organic EL device, and then the luminous efficiency (cd/m$^2$) was calculated depending on the measured current density (mA/cm$^2$) and brightness (cd). Here, the center of the glass substrate 11 can be determined using a photometer. Such luminous efficiency was estimated in four emitting portions 18a~18d formed on the glass substrate 11. The result of the evaluation will be shown in table 4.

(Sixth Evaluation) Luminous Property

Under the condition that the organic EL device was supplied with 10V, the luminescence was estimated. This evaluation was performed by naked eyes, and the luminescence was estimated with respect to the following reference. Such luminous property was estimated in four emitting portions 18a~18d formed on the glass substrate 11. The result of the evaluation will be shown in table 5.

O: good luminescence is shown throughout the surface

Δ: there is locally non-emitted x: there is relatively large non-emitted area (Seventh Evaluation) Variation Between Luminous Properties on the Main Surface of the Glass Substrate 11

In the foregoing embodiments and comparative examples, variation between luminous properties on the main surface of the glass substrate 11 was estimated. This evaluation was performed by measuring the respective luminous efficiencies of the emitting portions (18a~18d), and then the maximum luminous efficiency (Emax) and the minimum luminous efficiency (Emin) were estimated with respect to the following reference. Like the first evaluation, the luminous efficiency was estimated under the condition that a voltage of 10V was applied to the organic EL device. The result of the estimation will be shown in table 6.

O: Emin/Emax is beyond 0.90

Δ: Emin/Emax is within 0.80 and 0.90 x: Emin/Emax is below 0.80

TABLE 4

(Fifth evaluation)

|  | Emitting portion 18a | Emitting portion 18b | Emitting portion 18c | Emitting portion 18d |
|---|---|---|---|---|
| Embodiment 11 | 4.63 | 4.57 | 4.65 | 4.71 |
| Embodiment 12 | 4.95 | 5.01 | 5.06 | 4.83 |
| Embodiment 13 | 4.39 | 4.48 | 4.31 | 4.20 |
| Embodiment 14 | 4.53 | 4.51 | 4.46 | 4.53 |
| Embodiment 15 | 4.46 | 4.30 | 4.51 | 4.63 |
| Embodiment 16 | 4.30 | 4.21 | 4.28 | 4.06 |
| Embodiment 17 | 4.12 | 4.30 | 4.06 | 4.18 |
| Comparative example 7 | 3.92 | 3.87 | 4.03 | 3.81 |
| Comparative example 8 | 3.16 | 3.23 | 3.43 | 2.81 |
| Comparative example 9 | — | 3.56 | 4.23 | 4.53 |
| Comparative example 10 | — | — | 3.29 | — |

TABLE 5

(Sixth evaluation)

|  | Emitting portion 18a | Emitting portion 18b | Emitting portion 18c | Emitting portion 18d |
|---|---|---|---|---|
| Embodiment 11 | o | o | o | o |
| Embodiment 12 | o | o | o | o |
| Embodiment 13 | o | o | o | o |
| Embodiment 14 | o | o | o | o |
| Embodiment 15 | o | o | o | o |
| Embodiment 16 | o | o | o | o |
| Embodiment 17 | o | o | o | o |
| Comparative example 7 | o | o | o | o |
| Comparative example 8 | o | o | Δ | Δ |
| Comparative example 9 | x | Δ | o | o |
| Comparative example 10 | x | x | o | x |

TABLE 6

(Seventh evaluation)

|  | Fourth evaluation (Emin/Emax) |
|---|---|
| Embodiment 11 | o(0.983) |
| Embodiment 12 | o(0.955) |
| Embodiment 13 | o(0.938) |
| Embodiment 14 | o(0.955) |
| Embodiment 15 | o(0.929) |
| Embodiment 16 | o(0.948) |
| Embodiment 17 | o(0.985) |
| Comparative example 8 | o(0.966) |
| Comparative example 9 | Δ(0.819) |
| Comparative example 10 | x |
| Comparative example 11 | x |
| Comparative example 12 | x |

As shown in Tables 4, 5, and 6, on the basis of the results of the evaluation of each embodiment and each comparative example, the substrate manufactured by the method according to the present invention was employed for the organic EL device, so that variation between luminous properties on the glass substrate 11 according to the positions was decreased, thereby stably manufacturing the organic EL device with good luminescence and improved luminous efficiency.

As described above, in the present method of manufacturing the substrate for the organic EL device, when the optical element is formed, the sol-gel coating solution or the organic metal cracking solution is filled into the optical element, wherein the coating solution is injected onto the substrate, thereby stably and easily forming the optical element on the substrate. Further, in the present method of manufacturing the substrate for the organic EL device, the dispersion solution of particles is applied to the substrate, thereby stably and easily forming the optical element on the substrate. Thus, according to the present invention, the optical element is precisely formed on the substrate, so that the organic EL device can be stably manufactured with low variation between the optical properties according to the positions of the substrate and with the improved luminous efficiency.

While the present invention has been described with reference to a particular embodiment, it is understood that the disclosure has been made for purpose of illustrating the invention by way of examples and is not limited to limit the scope of the invention. And one skilled in the art can make amend and change the present invention without departing from the scope and spirit of the invention.

What is claimed is:

1. A method of manufacturing a substrate with an optical element for an organic EL device, the method comprising the step of:
    filling grooves of the optical element with a coating solution, which comprises a sol-gel coating solution or an organic metal cracking solution,
    wherein an encapsulation member is mounted on a first surface of the substrate in order to fill the grooves with the coating solution, and the coating solution is injected into a gap between the encapsulation member and the optical element,
    wherein the grooves are formed in the first surface of the substrate,
    wherein the encapsulation member includes encapsulation side walls and a pressing member having a ventilating hole on an even surface facing a main surface of the substrate, and
    wherein the pressing member is inserted between the encapsulation sidewalls.

2. The method as claimed in claim 1, wherein a layer formed by the sol-gel coating solution or the organic metal cracking solution includes any one of a silicon oxide layer ($SiO_2$), a titanium oxide ($TiO_2$), an indium tin oxide (ITO), a zinc oxide ($ZnO_2$), a zirconium oxide ($ZrO_2$), a tantalum pentoxide layer ($Ta_2O_5$), and an aluminum oxide layer ($Al_2O_3$).

3. The method as claimed in claim 1, wherein the optical element includes a diffraction grating.

4. The method as claimed in claim 1, wherein the layer formed by the sol-gel coating solution or the organic metal cracking solution has a thickness less than 300 μm.

5. The method as claimed in claim 1, wherein the encapsulation member is made of resin having solubility in one of tetrahydrofuran, acetone, toluene, low-grade alcohol, and high-grade alcohol.

6. A method of manufacturing a substrate with an optical element for an organic EL device, the method comprising the step of:
    filling grooves of the optical element with sol-gel coating solution or organic metal cracking solution,
    wherein the coating solution is applied to the substrate, pressed, and plasticized,
    wherein an encapsulation member is provided on the substrate to press the coating solution, and the encapsulation member includes encapsulation side walls and a pressing member having a ventilating hole on an even surface facing a main surface of the substrate, and
    wherein the pressing member is inserted between the encapsulation sidewalls.

7. The method as claimed in claims 6, wherein a layer formed by the sol-gel coating solution or the organic metal cracking solution includes any one of a silicon oxide layer ($SiO_2$), a titanium oxide ($TiO_2$), an indium tin oxide (ITO), a zinc oxide ($ZnO_2$), a zirconium oxide ($ZrO_2$), a tantalum pentoxide layer ($Ta_2O_5$), and an aluminum oxide layer ($Al_2O_3$).

8. The method as claimed in claim 6, wherein the optical element includes a diffraction grating.

9. The method as claimed in claim 6, wherein the layer formed by the sol-gel coating solution or the organic metal cracking solution has a thickness less than 300 μm.

10. The method as claimed in claim 6, wherein the encapsulation member is made of resin having solubility in one of tetrahydrofuran, acetone, toluene, low-grade alcohol, and high-grade alcohol.

11. A method of manufacturing a substrate with an optical element for an organic EL device, the method comprising the step of:
    applying a dispersion solution of particles to the substrate in order to form the optical element,
    wherein an encapsulation member is provided on the substrate to press the dispersion solution, and the encapsulation member includes encapsulation side walls and a pressing member having a ventilating hole on an even surface facing a main surface of the substrate, and
    wherein the pressing member is inserted between the encapsulation sidewalls.

12. The method as claimed in claim 11, wherein the optical element is any one of a diffraction grating and a scattering surface.

13. The method as claimed in claim 12, wherein the diffraction grating with grooves and the scattering surface with unevenness are filled with the dispersion solution.

14. The method as claimed in claim 11, wherein the dispersion solution of particles is applied by any one of a spray method and an inkjet method.

15. The method as claimed in claim 11, wherein the dispersion solution of particles is any one of sol-gel coating solution or organic metal cracking solution, and a layer formed by the coating solution is any one of a silicon oxide layer ($SiO_2$), a titanium oxide ($TiO_2$), an indium tin oxide (ITO), a zinc oxide ($ZnO_2$), a zirconium oxide ($ZrO_2$), a tantalum pentoxide layer ($Ta_2O_5$), and an aluminum oxide layer ($Al_2O_3$).

16. The method as claimed in claim 11, wherein the dispersion solution of particles has a static surface tension of 20~50 dyne/cm relative to the substrate.

17. The method as claimed in claim 11, wherein the dispersion solution of particles has a viscosity of 1~10 cps.

18. The method as claimed in claim 11, wherein the dispersion solution of particles has a blended concentration of 10% or less of gross weight.

* * * * *